(12) United States Patent
Liang et al.

(10) Patent No.: US 8,102,632 B2
(45) Date of Patent: Jan. 24, 2012

(54) ELECTROSTATIC DISCHARGE POWER CLAMP TRIGGER CIRCUIT USING LOW STRESS VOLTAGE DEVICES

(75) Inventors: Yikai Liang, Cupertino, CA (US); Arvind Bomdica, Fremont, CA (US); Samudyatha Suryanarayana, Sunnyvale, CA (US); Gayatri Gopalan, Sunnyvale, CA (US); Min Xu, Mountain View, CA (US); Xin Liu, El Dorado Hills, CA (US); Ming-Ju Edward Lee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 34 days.

(21) Appl. No.: 12/406,684

(22) Filed: Mar. 18, 2009

(65) Prior Publication Data

US 2010/0238598 A1  Sep. 23, 2010

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl. .......................................... 361/56; 361/118
(58) Field of Classification Search ...................... 361/56
See application file for complete search history.

(56) References Cited

U.S. PATENT DOCUMENTS 7,061,737 B2 *  6/2006  Chen ............................. 361/91.1
7,245,467 B2 *  7/2007  Yeh et al. ........................ 361/56

* cited by examiner

*Primary Examiner* — Dharti Patel
(74) *Attorney, Agent, or Firm* — Volpe and Koenig, P.C.

(57) ABSTRACT

Embodiments of an IC protection circuit that protects low voltage supply transistors and circuits within the IC from excessive power supply levels and ESD events are described. A protection circuit situated between the IO pins of the IC and the internal circuitry of the IC includes a voltage drop network and a plurality of shunt circuits to protect the IC against excessive supply voltages and ESD voltages. Each shunt circuit includes an RC trigger stage and an NMOS shunt stage that are made using low-voltage devices. A protection circuit of the embodiments includes a high voltage IO pin interface, a voltage drop network coupled to the IO pin and comprising a plurality of forward-biased diodes connected in series to drop a high voltage on the IO pin to a low voltage level, an NMOS shunt transistor coupled between the voltage drop network and a ground terminal, and a trigger circuit coupled to the NMOS shunt transistor to activate the shunt transistor when a sensed input voltage rise time is shorter than a defined supply voltage rise time.

20 Claims, 4 Drawing Sheets

ELECTROSTATIC DISCHARGE POWER CLAMP TRIGGER CIRCUIT USING LOW STRESS VOLTAGE DEVICES

CROSS-REFERENCE TO RELATED APPLICATIONS

The present application is related to co-pending application entitled "Power Supply Equalization Circuit Using Distributed High-Voltage and Low-Voltage Shunt Circuits," filed on Mar. 18, 2009, U.S. patent application Ser. No. 12/406,705, and assigned to the assignee of the present application.

TECHNICAL FIELD

The disclosed embodiments relate generally to integrated circuit devices, and more specifically to high-voltage power supply and ESD protection circuits.

BACKGROUND OF THE DISCLOSURE

Modern integrated circuits (ICs) have different types of input/output (IO) interfaces to communicate with other integrated circuits. The interfaces often have different power supply voltage levels, such as 5V, 3.3V, 2.5V, 1.8V, and 1.2V to support a number of different peripheral devices. This voltage range is broken down into two main categories, high voltage (2.5V-5V and higher), and low voltage (1.2V-1.8V). Most modern transistors, such as those made to present process scales on the order of 45-65 nm processes, are capable of withstanding only low voltage supply levels (1.2V to 1.8V). Accommodating the entire possible range of supply voltages from high voltage (3.3V-5V) to low voltage (1.2V-1.8V) within a single IC represents a significant design and manufacturing challenge, as such voltages must be properly distributed and buffered within the IC to ensure proper operation and protection of the transistors within the device.

An IC can be severely damaged or destroyed when subjected to a voltage that is higher than the design voltage of the integrated circuit. Such high voltages may be due to different power supply levels, or spurious effects, such as Electrostatic Discharge (ESD) events. In general, higher supply voltage levels require the use of thick gate oxide CMOS transistors, but lower stress voltage devices may still required to be used for such higher supply levels. For example, a 3.3V device can be used for a 5V IO interface, and a 2.5V, 1.8V or even 1.2V device can be used for a 3V or 2.5V IO interface. Thus, during normal operation, ICs should be designed to accommodate relatively high supply voltage levels.

Besides potential high voltage exposure during normal operation, all ICs must be protected from ESD effects, since the potential for exposure to such high voltage discharge is ever-present. ESD can originate from sources such as storage bags, device carriers, machinery, host devices, and people. Such sources can easily generate a voltage that is many times greater than the design voltage of an IC. For example, the typical human body can supply an electrostatic discharge of up to 6 KV (kilovolts), as compared to the standard operating voltage for an IC of 5 V or less.

To protect the internal circuitry of an IC from high voltage or ESD events, protection circuits are utilized, such as between the internal circuitry and the IO pins of the IC. Present protection circuits typically utilize reverse-biased diodes acting as avalanche breakdown clamps to limit the voltage between the power supply terminals of the IC. A problem associated with this approach is that the breakdown voltage of the diode can vary widely depending on design and fabrication variations. With advances in process technology, devices become ever smaller, and consequently, have ever lower electrostatic discharge (ESD) break down voltages.

One mechanism that can cause circuit failures during ESD events is a phenomenon known as bipolar snapback. During bipolar snapback, a parasitic bipolar device can conduct large amounts of ESD discharge current by means of a self-biased mechanism through the inherent substrate resistance of the device. Many CMOS devices utilize stacked snapback NMOS structures for ESD protection. These generally work adequately during pulsed ESD operation but experience difficulties at continuous excessive currents or very high currents. A typical NMOS snapback device includes a gate defined by a poly layer, a drain in the form of an n+ region and silicide, and a source. NMOS snapback structures operate using strong avalanche multiplication of charge carriers to create conductivity modulation in the on-state.

Devices utilizing advanced CMOS process technology suffer from the fact that the transistors have less breakdown voltage to protect against ESD. Typically, the stacked snapback voltage has breakdown voltage of about 10V. Such present stacked NMOS snapback devices cannot efficiently protect the device robustly enough from ESD, even in 100 nm technology.

BRIEF DESCRIPTION OF THE DRAWINGS

Embodiments are illustrated by way of example and not limitation in the figures of the accompanying drawings, in which like references indicate similar elements and in which.

DETAILED DESCRIPTION

Embodiments of the invention as described herein provide a solution to the problems of conventional methods as stated above. In the following description, various examples are given for illustration, but none are intended to be limiting.

Embodiments of an IC protection circuit that protects low voltage supply transistors and circuits within the IC from excessive power supply levels and ESD events are described. A protection circuit situated between the IO pins of the IC and the internal circuitry of the IC includes a voltage drop network and a plurality of shunt circuits to protect the IC against excessive supply voltages and ESD voltages. Each shunt circuit includes an RC trigger stage and an NMOS shunt stage that are made using low-voltage devices. The shunt circuits are coupled through an equalization device that comprises a PMOS transistor placed in series between pairs of shunt circuits.

Figure 1:
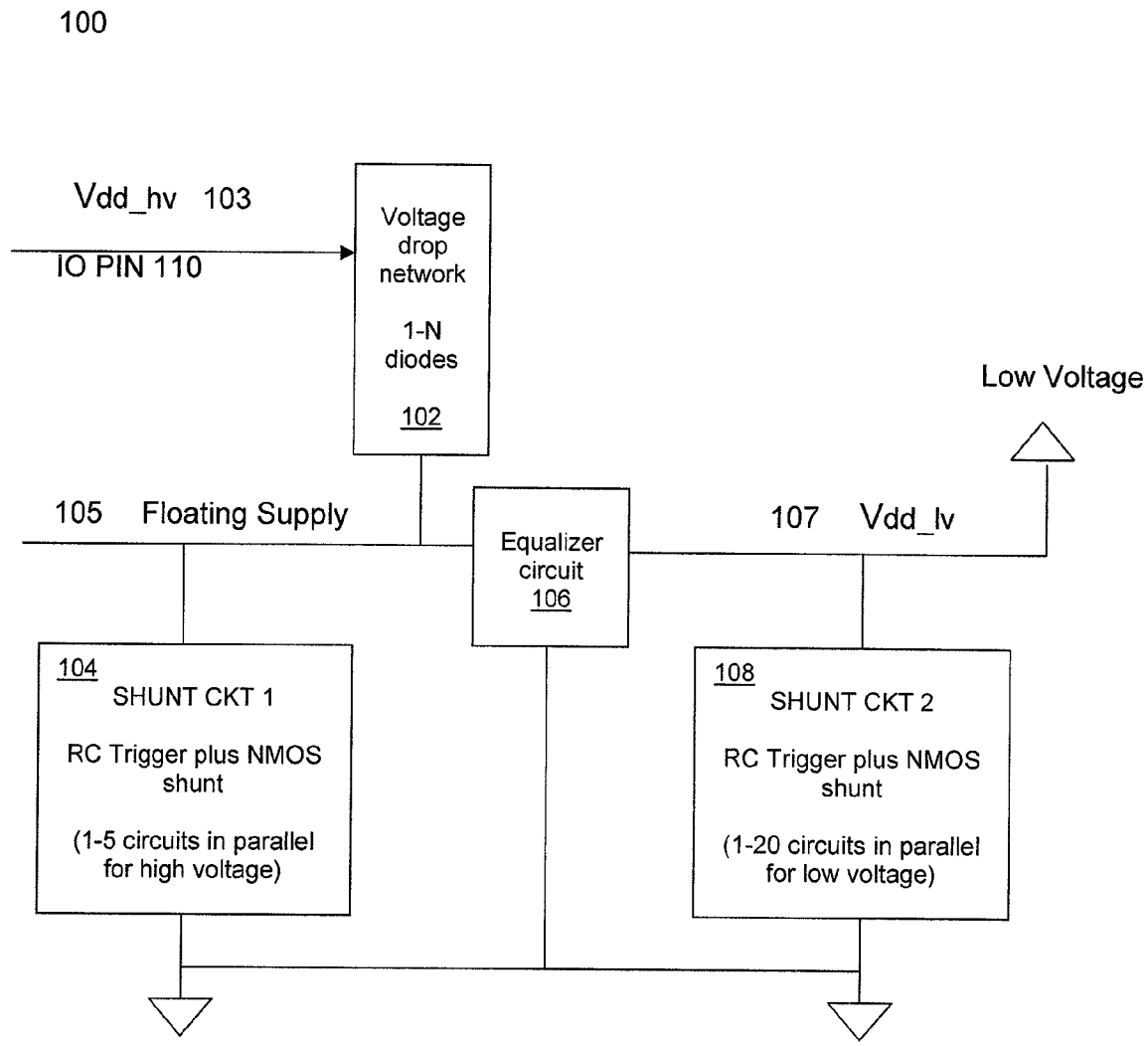
FIG. 1 illustrates a block diagram of a high-voltage/ESD power clamp trigger circuit that uses low stress voltage devices under an embodiment.

FIG. 1 illustrates a block diagram of a high-voltage/ESD power clamp trigger circuit that uses low stress voltage devices under an embodiment. The circuit of FIG. 1 provides protection to internal IC circuits from either or both of excessively high supply voltage levels and ESD or similar voltage spike events. Circuit 100 comprises a voltage drop network (VDN) 102 that is connected to one or more IO pins 110. The IO pin 110 provides a high voltage supply level Vdd_hv 101, as well as a potential entry point for any ESD voltage that may be introduced to the IC. The voltage drop network 102 is coupled to a first shunt circuit 104, and one or more additional shunt circuits 108-110 connected in series. The two or more shunt circuits are coupled to one another through an equalizer circuit (or equalization device) 106.

It is assumed that the internal IC device circuits are configured to operate at a relatively low voltage levels (e.g., 1.0V to 1.8V) Vdd_lv, as provided by the low voltage power supply rail 107.

The voltage drop network 102 provides a voltage drop from the higher voltage Vdd_hv to a voltage that is below the device stress voltage, Vdd_lv. The VDN can be implemented through a serial diode chain, or through diode-connected NMOS or PMOS devices, or through any other similar circuit. The shunt circuits 102 and 108 may be implemented through RC trigger circuits with NMOS shunt devices, or any similar circuit, and are made using low-voltage circuits, also referred to as "low stress voltage" devices. The RC trigger circuits sense an ESD event and turn on the NMOS ESD shunt devices to provide a current return path to ground for the ESD current. The time constant of the RC network is designed to be on the order of 150 ns to 600 ns to provide enough time for power clamp, but is not so limited.

In one embodiment, the equalizer circuit 106 is implemented as a PMOS device, but is not so limited. The equalizer circuit can be used when the Vdd_lv level 107 is the same as the device stress voltage. It provides an extra current path for both Vdd_hv and Vdd_lv ESD event. This provides a higher ESD tolerance voltage and/or better ESD area efficiency.

For circuit 100, a number of shunt circuits 104, 108, and 110 may be coupled in series through one or more equalizer circuits 106. The trigger circuits for the multiple shunt circuits work in tandem to provide current paths to ground. Thus each additional shunt circuit provides additional current shunt capability to circuit 100. For example, if two shunt circuits are employed, shunt circuit 104 may shunt 80% of the current, and shunt circuit 108 may shunt the remaining 20% to ground. The choice of devices and their relative distance are parameters that can be used to dictate the relative amount of current dropped by each shunt circuit. The number, N, of shunt circuits depends on the operating characteristics of the IC circuit. For example, one to five shunt circuits can be used for high-stress level ICs and up to 20 or so shunt circuits can be used for low-stress level ICs.

As shown in FIG. 1, circuit 100 creates a floating rail (or supply) 105 that is connected to the high voltage level Vdd_hv using the VDN, and to the low voltage supply Vdd_lv. During normal operation, the floating rail voltage will correspond to the Vdd_lv level, for example 1.8V. During an ESD event, however, the floating rail 105 is made to correspond to the Vdd_lv level through the combination voltage drop networks and shunt circuits.

Figure 2:
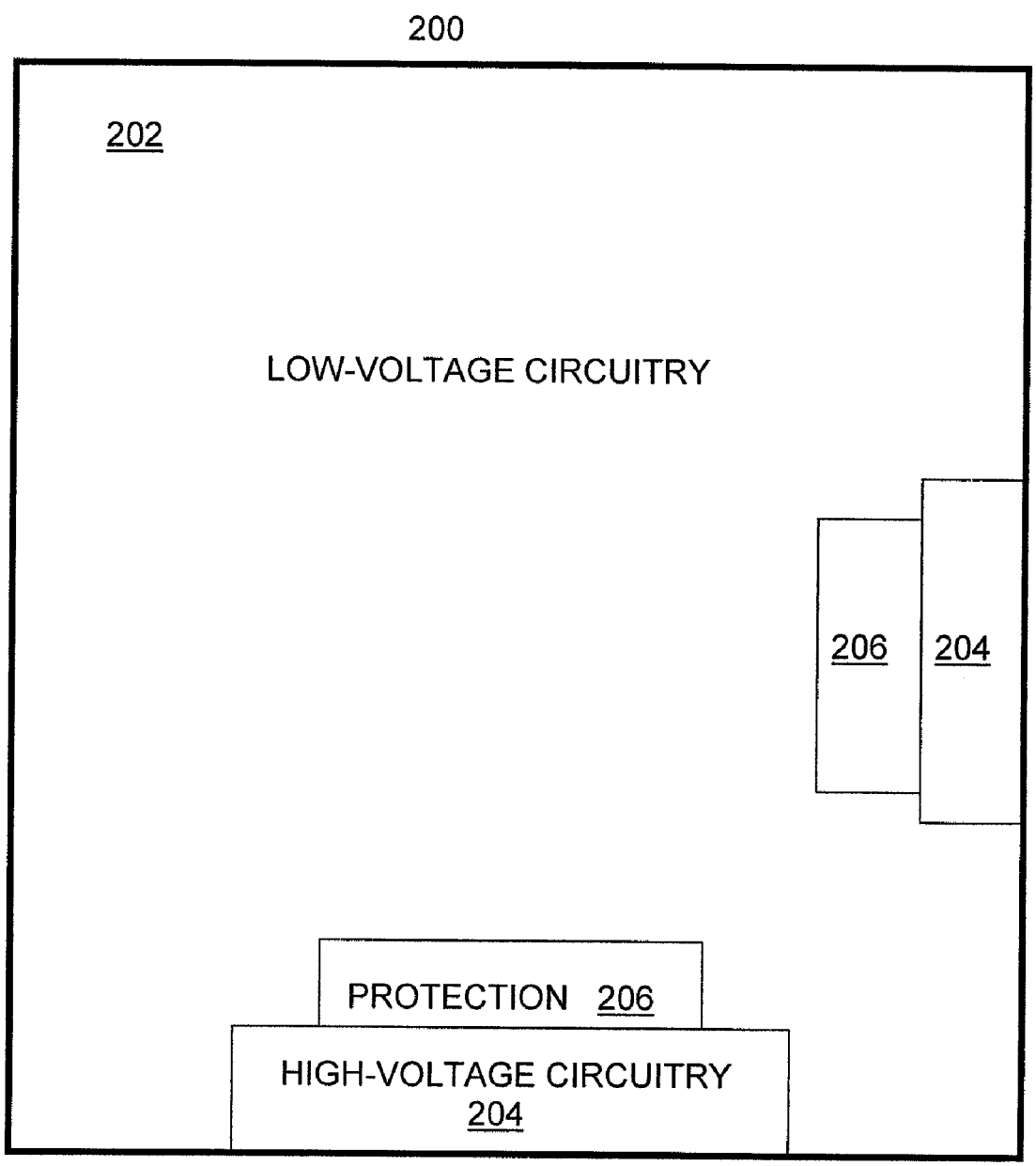
FIG. 2 illustrates an example distribution of high voltage and low voltage devices in an IC with integrated protection circuitry, under an embodiment.

The IO pin 110 may be connected to a high voltage supply that can provide any number of high voltage levels, such as 2.5, 3.0, 3.3, 5.0V and so on. Such high voltage levels are typically utilized by only a small number of devices on the IC, with the majority of internal circuits configured to operate at low voltage levels (e.g., 1.2-1.8V). In general, a typical IC may thus comprise on the order of 80%-90% low voltage devices, and only 10%-20% high voltage areas. FIG. 2 illustrates an example distribution of high voltage and low voltage devices in an IC with integrated protection circuitry, under an embodiment. IC device 200 comprises a number of circuits made up of low voltage transistors and devices 202 and high voltage transistors and devices 204. The low voltage devices 202 operate using low voltage supply levels Vdd_lv, and the high voltage devices operate using high voltage supply levels Vdd_hv. In a typical IC, the high voltage devices are located on the periphery of the IC, and comprise a relatively small portion of the IC, such as on the order of 5-20%. However, the high voltage circuits may also be distributed throughout the IC and may comprise a higher proportion of the IC, depending on the actual IC design. For the system of FIG. 2, the high voltage areas are associated with the IO regions of the IC and provide high voltage supply levels, as well as possible areas of entry for high voltage discharge from potential ESD sources. In one embodiment, the one or more high voltage circuit areas 204 are coupled to the low voltage circuits 202 through one or more protection circuits 206, as shown in FIG. 1. The protection circuits 206 protect the low voltage circuits 202 from potential ESD effects as well as the possibly excessive Vdd_hv voltage levels. In an embodiment, the protection circuits 206 themselves are made using low-voltage devices, as opposed to high-voltage devices.

In one embodiment, protection between the high voltage circuits and the low voltage circuits is provided by a number of shunt circuits within each protection circuit 206. As shown in FIG. 1, shunt circuit 104 provides a shunt for the high voltage level Vdd_hv to ground, and shunt circuit 108 provides a shunt for the low voltage level Vdd_lv to ground. Each shunt circuit may represent a number of shunt devices in parallel. The number of devices depends on the relative number of circuits to protect. For example, for a typical IC as illustrated in FIG. 2 with roughly 10-20% high voltage circuits and 80-90% low voltage circuits, there may be on the order of five shunt devices in shunt circuit 104 that are coupled in parallel to the floating rail 105, and up to 20 or so additional shunt devices in shunt circuit 108 that are coupled in parallel to the low voltage supply Vdd_lv.

Figure 3:
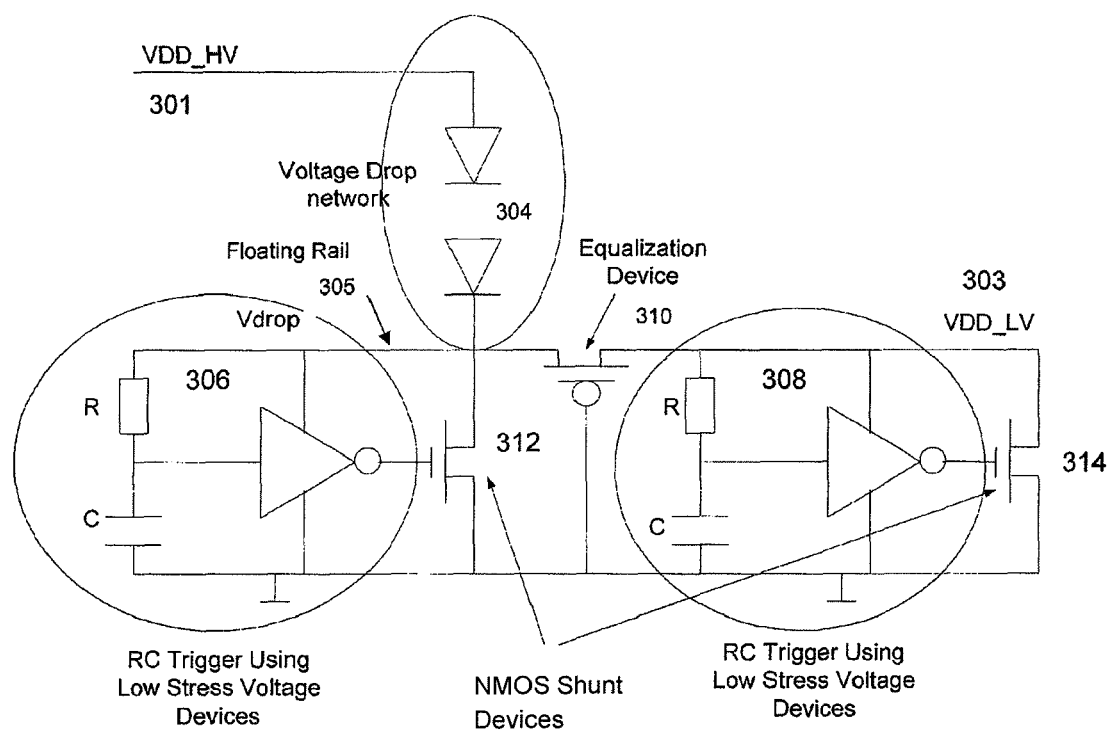
FIG. 3 is a circuit diagram of a high-voltage/ESD power clamp trigger circuit that uses low stress voltage devices, under an embodiment.

FIG. 3 is a circuit diagram of a high-voltage/ESD power clamp trigger circuit comprising a protection circuit that uses low stress voltage devices, under an embodiment. Circuit 300 illustrates one possible device-level implementation of the protection circuit 100 illustrated in FIG. 1. The high voltage supply level 301 is input to a voltage drop network (VDN) 304. For the embodiment of FIG. 3, VDN 304 is implemented as a number forward-drop diodes coupled in series. The number of diodes depends on the voltage level of Vdd_hv and the low voltage level of Vdd_lv, 303. The lower node of VDN 304 is coupled to floating rail 305. The floating rail 305 is coupled to a high voltage shunt circuit that comprises an RC trigger stage 306 and an NMOS shunt transistor 312. Transistor 312 forms the shunt device portion of shunt circuit 104 in FIG. 1.

For the embodiment of FIG. 3, the trigger portion 306 of the shunt circuit is an RC trigger, though any similar type of trigger circuit may be used. RC trigger circuit 306 comprises a resistor (R) coupled in series to a capacitor (C), which are connected to an ESD trigger inverter. The RC trigger circuit 306 takes advantage of the fact that it is possible to distinguish between an ESD event and a normal application of power by a difference in rise time. For example, an ESD event may result in a rise time on a power supply line in the range of 10 nanoseconds, whereas the rise time during regular application of power to the supply line may be on the order of greater than 1 microsecond. The ESD shunt circuit 100 makes use of an RC time constant produced by a series configuration of the trigger capacitor and the trigger resistor. The RC time constant is selected such that it is shorter than a magnitude of a rise time expected on a power supply node and also sufficiently long enough to provide full dissipation of a charge build up from an ESD event prior to turning off a shunt. The time required to discharge the ESD event is dependent on the time constant determined by a discharging network and the RC time constant of the trigger device. The ESD shunt trigger line from the trigger inverter is coupled to the NMOS shunt transistor 312, which shunts the ESD current to ground or source voltage Vss.

A second RC trigger 308 and NMOS shunt 314 circuit are coupled between the low voltage supply rail Vdd_lv 303 and ground. The first and second shunt circuits are coupled to each other through an equalization device 310, which in one embodiment is implemented as a single PMOS transistor, as shown in circuit 300. The NMOS ESD shunt devices 312 and 314 provide the power clamp from Vdd_hv to Vss and Vdd_lv to Vss during ESD event to protect the IC from ESD damage.

During normal operation (non ESD protection mode) the high voltage level Vdd_hv 301 from the high voltage portion of the IC is applied to the protection circuit. In certain cases, this voltage may be excessively high and cause an overstress voltage for the low voltage portions of the IC. The protection circuit 300 protects the IC from any such overstress caused by the high voltage sources. The Vdd_hv voltage will go through the forward-biased diodes of the VDN 304 that drops the voltage from Vdd_hv to the $V_{drop}$ level. In one embodiment, the $V_{drop}$ value is dictated by the following two equations:

$$V_{drop} = Vdd\_hv - \Delta V \quad (1)$$

$$V_{drop} < Vdd\_hv - \Delta V \quad (2)$$

In the above equations, $\Delta V$ is the number of diodes in the VDN 304. The VDN 304 is configured to drop the $V_{drop}$ voltage to below the device overstress voltage and the Vdd_lv value. Thus, the circuits of the IC will be protected from voltage overstress. If an equalization device is present, the $V_{drop}$ level will be pulled to the low voltage rail Vdd_lv 303. Thus, during normal operation the equalization device 310 is used to hold the $V_{drop}$ level to Vdd_lv to avoid a lower voltage on $V_{drop}$.

During an ESD event, the IC device is not powered up, so the Vdd_hv and Vdd_lv rails to not carry their normal operating currents. Instead they provide pathways for any ESD current. Thus, the voltage spike current typically travels through the Vdd_hv rail 301, and possibly, the Vdd_lv rail to the internal IC circuitry. In circuit 300, the ESD current will run through the VDN forward-biased diodes 304 and trigger the RC trigger circuit 306 to turn on the NMOS shunt 312 in the first shunt device. Part of the ESD current will also go through the equalization device 310 to trigger the Vdd_lv RC trigger circuit 308 to turn on NMOS shunt 314. In this manner, circuit 300 provides higher ESD protection voltage or better area ESD protection efficiency than current protection circuits, such as NMOS snapback devices.

During an ESD event, the shunt 312 provides the Vdd_hv to ground path to discharge the ESD energy. When ESD current is discharged through the low voltage rail Vdd_lv 303, the low voltage shunt 314 and RC trigger 308 provides an ESD discharge path from Vdd_lv to ground. The reverse-biased diodes in VDN 304 will block the current path from Vdd_lv to Vdd_hv. This also prevents the need from the ESD structure requiring a power-up sequence. In ESD protection mode, the equalization device 310 provides an additional ESD current path through the Vdd_lv ESD shunt 314 for ESD current from Vdd_hv, or to the Vdrop shunt 312 for ESD current from Vdd_lv.

The equalization device 310 thus allows the high voltage shunt circuit 312 and the low voltage shunt circuit 314 to work together to dissipate the ESD current. As described above with reference to FIGS. 1 and 2, a number of low voltage and high voltage shunt devices may be used in parallel to expand the current dissipating capacity of the protection circuit. In this case, there would be a number of RC trigger circuits 306 and high voltage shunts 312 connected in parallel depending on the relative amount of high voltage devices in the IC, and a second number of RC trigger circuits 308 and low voltage shunts 314 connected in parallel depending on the relative amount of low voltage devices in the IC. In a typical IC, there would usually be on the order of four to five times as many low voltage trigger and shunt devices than high voltage trigger and shunt devices, depending on the relative proportion of high and low voltage devices in the IC. The use of an equalization device 310 coupling the high and low voltage shunt circuits to one another eliminates the need to grow the circuit size of the IC to provide extra protection for the high voltage devices. That is, through the use of high and low voltage shunts coupled through an equalizer device, the protection circuit 300 can be configured to provide ESD protection to practically any number of low voltage and high voltage devices without requiring extensive growth of the IC.

Figure 4:
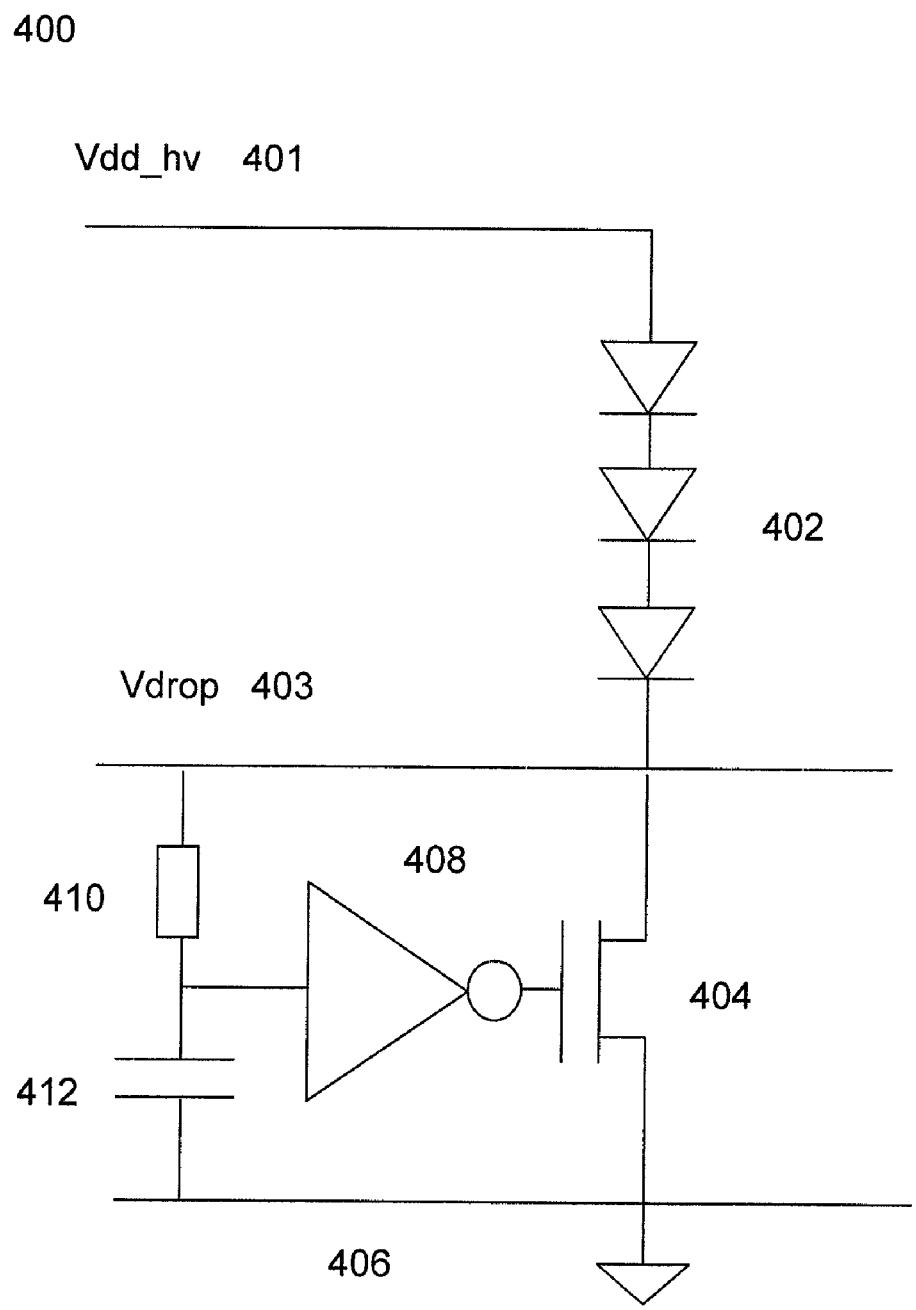
FIG. 4 illustrates a single-stage protection circuit using low-stress voltage devices, under an embodiment.

Embodiments of the protection circuit 300 include an individual shunt circuit that works in conjunction with a voltage drop network to efficiently provide ESD protection against voltage spikes through an IO pin. FIG. 4 illustrates a single-stage ESD protection circuit for protecting low voltage devices from ESD events on a high voltage IO pin, under an embodiment. As shown in circuit 400 a high voltage IO pin 401 is coupled to a voltage drop network 402 that comprises a number of forward-bias diodes connected in series. These diodes drop the voltage from the Vdd_hv level to a lower voltage level (Vdrop) 403, depending on the number of diodes in the VDN 402. An RC trigger circuit 406 consisting of a resistor 410 in series with capacitor 412 and coupled to a trigger inverter 408 provides a trigger control signal that activates NMOS shunt transistor 404. Circuit 400 provides an efficient means of protecting low voltage circuits from ESD effects that may be introduced on high voltage IO pins. It offers benefits over present NMOS snapback systems in that it is scalable to lower device sizes and enables the use of RC shunts in conjunction with high voltages (e.g., 5V) using low stress voltage devices.

Embodiments described herein are directed to a circuit for protecting low voltage devices within an integrated circuit (IC) from electrostatic discharge (ESD) events, comprising: a high voltage input/output (IO) pin, a voltage drop network coupled to the IO pin and comprising a plurality of forward-biased diodes connected in series to drop a high voltage on the IO pin to a low voltage level, an NMOS shunt transistor coupled between the voltage drop network and a ground terminal, and a trigger circuit coupled to the NMOS shunt transistor to activate the shunt transistor when a sensed input voltage rise time is shorter than a defined supply voltage rise time. In this circuit, the high voltage level may be a voltage within the range of 3.3V to 5V, and the plurality of diodes may comprise two to four diodes connected in series. The trigger circuit may be a resistor-capacitor (RC) trigger circuit comprising a capacitor coupled in series to a resistor and a trigger inverter. For this embodiment, the resistor and capacitor values are selected to produce an RC time constant that is shorter than an expected rise time for the high voltage rail, and long enough to provide full dissipation of a charge build up from the ESD event prior to activation of the NMOS shunt transistor. The RC time constant may be in the range of 10 nanoseconds to 1 microsecond.

The systems and/or components described herein may be implemented as one or more electronic circuits. Such circuits described herein can be implemented through the control of manufacturing processes and maskworks, which would be then used to manufacture the relevant circuitry. Such manufacturing process control and maskwork generation known to those of ordinary skill in the art include the storage of computer instructions on computer readable media including, for example, Verilog, VHDL or instructions in other hardware description languages.

Aspects of the system described herein may be implemented as hardware circuitry involving several different device processes. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the IC protection circuit is not intended to be exhaustive or to limit the embodiments to the precise form or instructions disclosed. While specific embodiments of, and examples for, circuits and components are described herein for illustrative purposes, various equivalent modifications are possible within the scope of the disclosed methods and structures, as those skilled in the relevant art will recognize.

The elements and acts of the various embodiments described above can be combined to provide further embodiments. These and other changes can be made to the disclosed system in light of the above detailed description.

In general, in the following claims, the terms used should not be construed to limit the disclosed method to the specific embodiments disclosed in the specification and the claims, but should be construed to include all operations or processes that operate under the claims. Accordingly, the disclosed structures and methods are not limited by the disclosure, but instead the scope of the recited method is to be determined entirely by the claims.

While certain aspects of the disclosed embodiments are presented below in certain claim forms, the inventors contemplate the various aspects of the methodology in any number of claim forms. Accordingly, the inventor reserves the right to add additional claims after filing the application to pursue such additional claim forms for other aspects.

What is claimed is:

1. A circuit for protecting low voltage devices within an integrated circuit (IC) from an electrostatic discharge (ESD) event, comprising:
    a high voltage input/output (IO) pin associated with a high voltage level;
    a low voltage IO pin associated with a low voltage level;
    a voltage drop network coupled to the high voltage IO pin and comprising a plurality of forward-biased diodes connected in series to drop the high voltage level on the high voltage IO pin to the low voltage level; and
    a first shunt circuit coupled to the high voltage IO pin via the voltage drop network and a second shunt circuit coupled to the low voltage IO pin, the first and second shunt circuits being configured to operate in tandem during the ESD event;
    each shunt circuit having an NMOS shunt transistor coupled between the voltage drop network and a ground terminal and a trigger circuit coupled to the NMOS shunt transistor to activate the shunt transistor when a sensed input voltage rise time is shorter than a defined supply voltage rise time.

2. The circuit of claim 1 wherein the high voltage level is a voltage within the range of 3.3V to 5V.

3. The circuit of claim 1 further comprising an equalizer circuit configured to provide a current path between the first and second shunt circuits during the ESD event.

4. The circuit of claim 3 wherein the trigger circuit is a resistor-capacitor (RC) trigger circuit comprising a capacitor coupled in series to a resistor and a trigger inverter.

5. The circuit of claim 4 wherein the resistor and capacitor values are selected to produce an RC time constant that is shorter than an expected rise time for the high voltage rail, and long enough to provide full dissipation of a charge build up from the ESD event prior to activation of the NMOS shunt transistor.

6. The circuit of claim 5 wherein the RC time constant is in the range of 10 nanoseconds to 1 microsecond.

7. An electrostatic discharge (ESD) protection circuit comprising:
    a voltage drop network dropping a high voltage generated by a high voltage power supply on an integrated circuit (IC) device to a lower voltage level on a low voltage rail; and
    first and second shunt circuits coupled between the low voltage rail and ground, the first and second shunt circuits being configured to operate in tandem and shunt excessive current to ground during an ESD event based on a trigger signal;
    each shunt circuit having a resistor-capacitor (RC) trigger circuit coupled to the voltage drop network through the low voltage rail and generating a trigger signal when a sensed input voltage rise time is shorter than a defined typical voltage rise time of the high voltage power supply.

8. The circuit of claim 7 wherein the voltage drop network comprises is coupled to a high voltage input/output pin, and comprises a plurality of forward-biased diodes connected in series to drop the high voltage on the IO pin to the lower voltage level.

9. The circuit of claim 8 wherein the high voltage level is a voltage within the range of 3.3V to 5V, and wherein the lower voltage level is a voltage within the range of 1.2V to 1.8V.

10. The circuit of claim 7 wherein the shunt circuit comprises an NMOS transistor.

11. The circuit of claim 7 further comprising an equalizer circuit configured to provide a current path between the first and second shunt circuits during the ESD event.

12. The circuit of claim 7 wherein the RC trigger circuit has resistor and capacitor values selected to produce an RC time constant that is shorter than an expected rise time for the high voltage rail, and long enough to provide full dissipation of a charge build up from the ESD event prior to activation of the shunt circuit.

13. A method of protecting an integrated circuit (IC) from an electrostatic discharge (ESD) event, comprising:

dropping a high voltage level generated by a high voltage power supply on the IC to a lower voltage level on a low voltage rail through a voltage drop network;

shunting excessive current to ground through first and second shunt circuits during an ESD event based on a trigger signal;

providing a current path between the first and second shunt circuits;

inputting the lower voltage to the resistor-capacitor (RC) trigger circuits;

each RC trigger circuit generating a trigger signal when a rise time sensed on the low voltage rail is shorter than a defined voltage rise time, wherein the first shunt circuit is coupled to the high voltage level via the voltage drop network and the second shunt circuit is coupled to the low voltage level.

14. The method of claim 13 wherein providing a current path between the first and second shunt circuits comprises providing a PMOS transistor coupled between the first and second shunt circuits.

15. The method of claim 13 wherein the high voltage level is a voltage within the range of 3.3V to 5V, and wherein the lower voltage level is a voltage within the range of 1.2V to 1.8V.

16. The method of claim 13 wherein the RC trigger circuit comprises a capacitor coupled in series to a resistor and a trigger inverter, the trigger inverter generating the trigger signal.

17. The method of claim 16 wherein the RC trigger circuit parameters are selected to produce an RC time constant that is shorter than an expected rise time for the high voltage rail, and long enough to provide full dissipation of a charge build up from the ESD event prior to activation of the shunt circuit.

18. The method of claim 13 wherein the components of the RC trigger circuit and the shunt circuit are configured to operate only at the lower voltage level.

19. A non-transitory computer readable media storing instructions thereon wherein said instructions are adapted to control a manufacturing process to manufacture a circuit comprising:

a high voltage input/output (IO) pin associated with a high voltage level;

a low voltage IO pin associated with a low voltage level;

a voltage drop network coupled to the high voltage IO pin and comprising a plurality of forward-biased diodes connected in series to drop a high voltage on the IO pin to a low voltage level; and a first shunt circuit coupled to the high voltage IO pin via the voltage drop network and a second shunt circuit coupled to the low voltage IO pin, the first and second shunt circuits being configured to operate in tandem during the ESD event;

each shunt circuit having an NMOS shunt transistor coupled between the voltage drop network and a ground terminal and a trigger circuit coupled to the NMOS shunt transistor to activate the shunt transistor when a sensed input voltage rise time is shorter than a defined supply voltage rise time.

20. The computer readable media of claim 19 wherein said instructions comprise hardware description language instructions.

* * * * *

UNITED STATES PATENT AND TRADEMARK OFFICE
CERTIFICATE OF CORRECTION

PATENT NO. : 8,102,632 B2
APPLICATION NO. : 12/406684
DATED : January 24, 2012
INVENTOR(S) : Liang et al.

It is certified that error appears in the above-identified patent and that said Letters Patent is hereby corrected as shown below:

At column 5, line 27, in the second equation, delete "Vdrop < Vdd_hv- $\Delta$V" and insert therefor
-- Vdrop < Vdd_lv --;

Signed and Sealed this
Seventh Day of August, 2012

David J. Kappos
*Director of the United States Patent and Trademark Office*